US006434010B1

(12) United States Patent
Hsu (10) Patent No.: US 6,434,010 B1
(45) Date of Patent: Aug. 13, 2002

(54) IC CARD ASSEMBLY (75) Inventor: Kuei Sang Hsu, Hsin-Dan (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/745,256

(22) Filed: Dec. 20, 2000

(30) Foreign Application Priority Data

Jul. 20, 2000 (TW) ........................................ 89212571 U (51) Int. Cl.$^7$ ............................ H05K 7/14; H01R 12/04
(52) U.S. Cl. ..................... 361/737; 361/736; 361/801; 439/76.1; 439/946
(58) Field of Search ................................ 361/728, 736, 361/737, 801; 439/76.1, 945, 946; 235/492

(56) References Cited

U.S. PATENT DOCUMENTS 5,472,351 A * 12/1995 Greco et al. ................ 439/353
6,122,175 A * 9/2000 Sheeh ........................ 361/737
6,183,308 B1 * 2/2001 Laity .......................... 439/676
6,247,968 B1 * 6/2001 Wu ............................ 439/607

* cited by examiner

Primary Examiner—Jayprakash N. Gandhi
(74) Attorney, Agent, or Firm—Wei Te Chung (57) ABSTRACT A PCMCIA I/O card assembly (1) includes a printed circuit board (PCB) (3), a dielectric supporting member (4), a lower cover (22), an upper cover (20), and a pair of bolts (8). The lower cover has a pair of frames (24), each forming a front head (241). The supporting member encloses and supports high-profile mating connectors (51, 52) mounted on the PCB, and includes upper and lower housings (40, 42). Both the upper and lower housings have rearwardly extending boards (406, 46), and upper and lower casings (41, 43) projecting forwardly from the boards. The lower housing board engages with the front heads, for reliably securing the lower housing to the lower cover. The boards are engageable with each other such that the supporting member is securely attached to the lower cover.

18 Claims, 7 Drawing Sheets

IC CARD ASSEMBLY

BACKGROUND OF THE INVENTION

1. Field of the Invention

The present invention relates to an IC card assembly, and particularly to an input/output card assembly which has a flat card portion and a connector portion for connecting with an external device, wherein the connector portion has a height which is much greater than a thickness of the flat card portion.

2. Brief Description of the Related Art

The Personal Computer Memory Card International Association (PCMCIA) has set up a standard so that card assemblies meeting the PCMCIA standard can be selectively connected to a computer to expand the computer's capability. Such card assemblies are particularly useful for compact computers such as notebooks and palmtops. An I/O card meeting the PCMCIA standard is used to connect the computer with a peripheral device such as a printer, a scanner, and a digital camera. To improve transmission speed between the peripheral device and the computer, an IEEE 1394 connector is generally used. The card assembly includes a card portion for receiving a PCMCIA card and a transition portion for receiving an IEEE 1394 connector. The transition portion has a profile much higher than that of the card portion. Thus a neck portion of the card assembly between the card portion and the transition portion is relatively weak, and is easily broken during insertion or withdrawal of the card assembly into and from a PCMCIA connector mounted in the computer. Therefore, it is necessary to provide a card assembly which has a supporting structure for reinforcing the neck portion.

Hence, an improved electrical connector is required to overcome the disadvantages of the prior art.

BRIEF SUMMARY OF THE INVENTION

Accordingly, an object of the present invention is to provide an I/O card assembly which has a high-profile connecting portion for connecting with a peripheral device, a flat card portion, and a neck portion between the connecting portion and the flat card portion, wherein a reinforcing structure is provided in the neck portion to protect the neck portion from damage.

To achieve the above-mentioned objects, a PCMCIA card assembly in accordance with the present invention includes a printed circuit board (PCB), a dielectric supporting member, a lower cover, an upper cover, and a pair of bolts. The lower cover has a pair of frames, each of which forms a front head. A body section of the PCB is enclosed by the covers. The supporting member encloses and supports high-profile mating connectors mounted on the PCB. The supporting member includes an upper housing and a lower housing. The lower housing forms a lower casing and a base board extending rearwardly from the lower casing. The upper housing forms an upper casing and a mounting board extending rearwardly from the upper casing. Both boards extend rearwardly beyond the front heads into a position between the covers, and the lower and upper casings project forwardly from the covers. The base board of the lower housing forms a pair of shoulder walls, a pair of blocks and a pair of abutting walls which all cooperate to engage with the heads of the lower cover and thus reliably secure the lower housing to the lower cover. The boards are engageable with each other such that the supporting member is securely attached to the lower cover. The upper cover is latched to the lower cover. The covers are received in a host device and the casings protrude from the host device.

Other objects, advantages and novel features of the present invention will become more apparent from the following detailed description of the present embodiment when taken in conjunction with the accompanying drawings.

DETAILED DESCRIPTION OF THE PREFERRED EMBODIMENT

Figure 1:
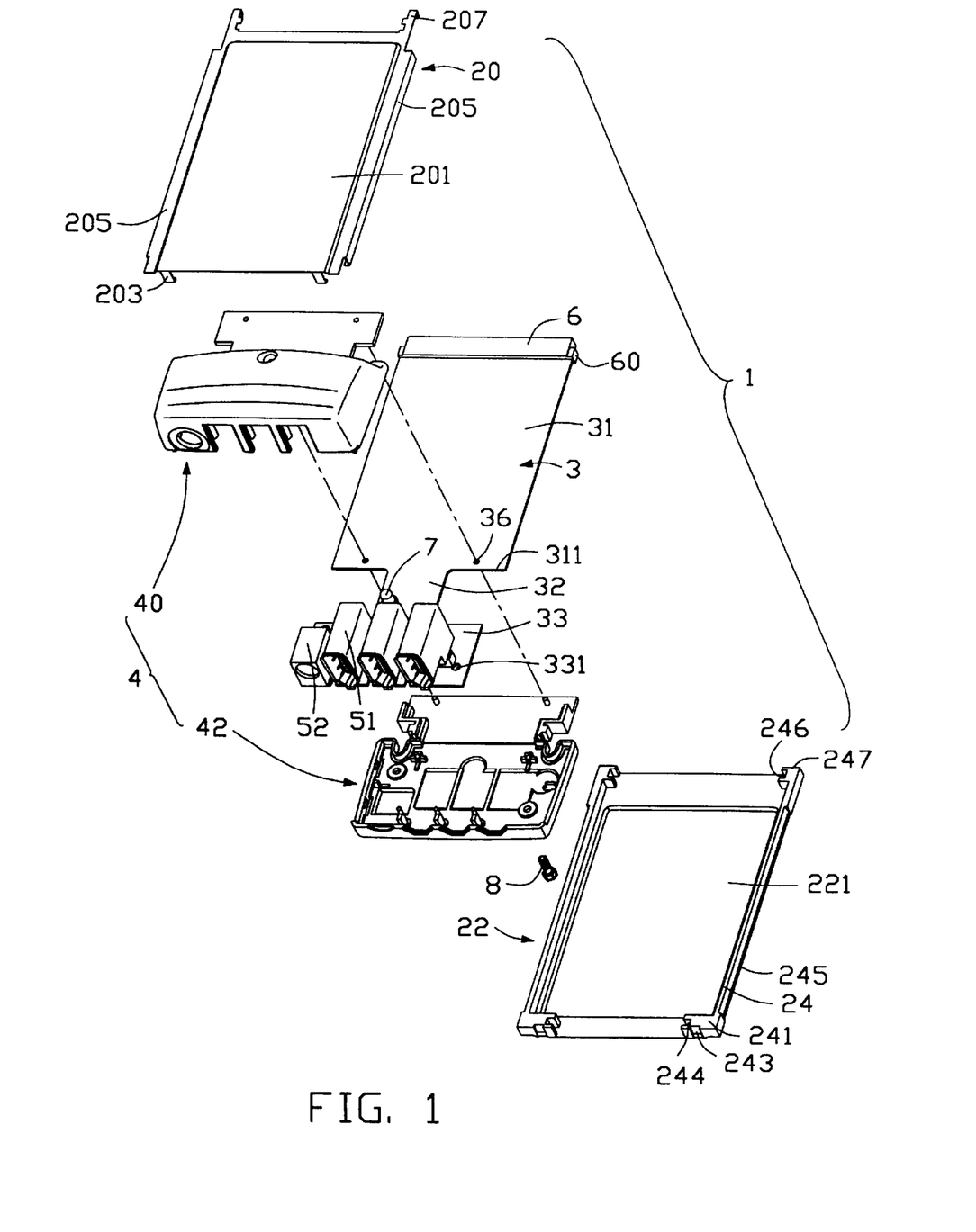
FIG. 1 is an exploded view of an I/O card assembly in accordance with the present invention.

Referring to FIG. 1, a PCMCIA I/O card assembly 1 of the present invention for establishing an electrical path between a host device (not shown) and a peripheral device (not shown) comprises a printed circuit board (PCB) 3, a dielectric supporting member 4, a lower cover 22, an upper cover 20 engageable with the lower cover 22, and a pair of bolts 8 (only one shown).

The PCB 3 has a body section 31, a neck section 32 extending forwardly from the body section 31, and a head section 33 extending forwardly from the neck section 32. A receptacle connector 6 is mounted at a rear end of the body section 31. A rectangular protrusion 60 projects from each end of the receptacle connector 6. A pair of first bores 36 is respectively defined in the body section 31 near a pair of corresponding front abuttingedges 311 of the body section 31. The neck section 32 has a light-emitting diode (LED) 7 for indicating operational status of the IC card assembly 1. The head section 33 defines a pair of diagonally opposite first holes 331 therein near respective opposite lateral sides thereof. Three IEEE 1394 connectors 51 are provided on the head section 33 for mating with a complementary connector (not shown) of a peripheral device. A power connector 52 sits beside the IEEE 1394 connectors 51 for mating with a complementary connector (not shown) of the peripheral device.

Figure 2:
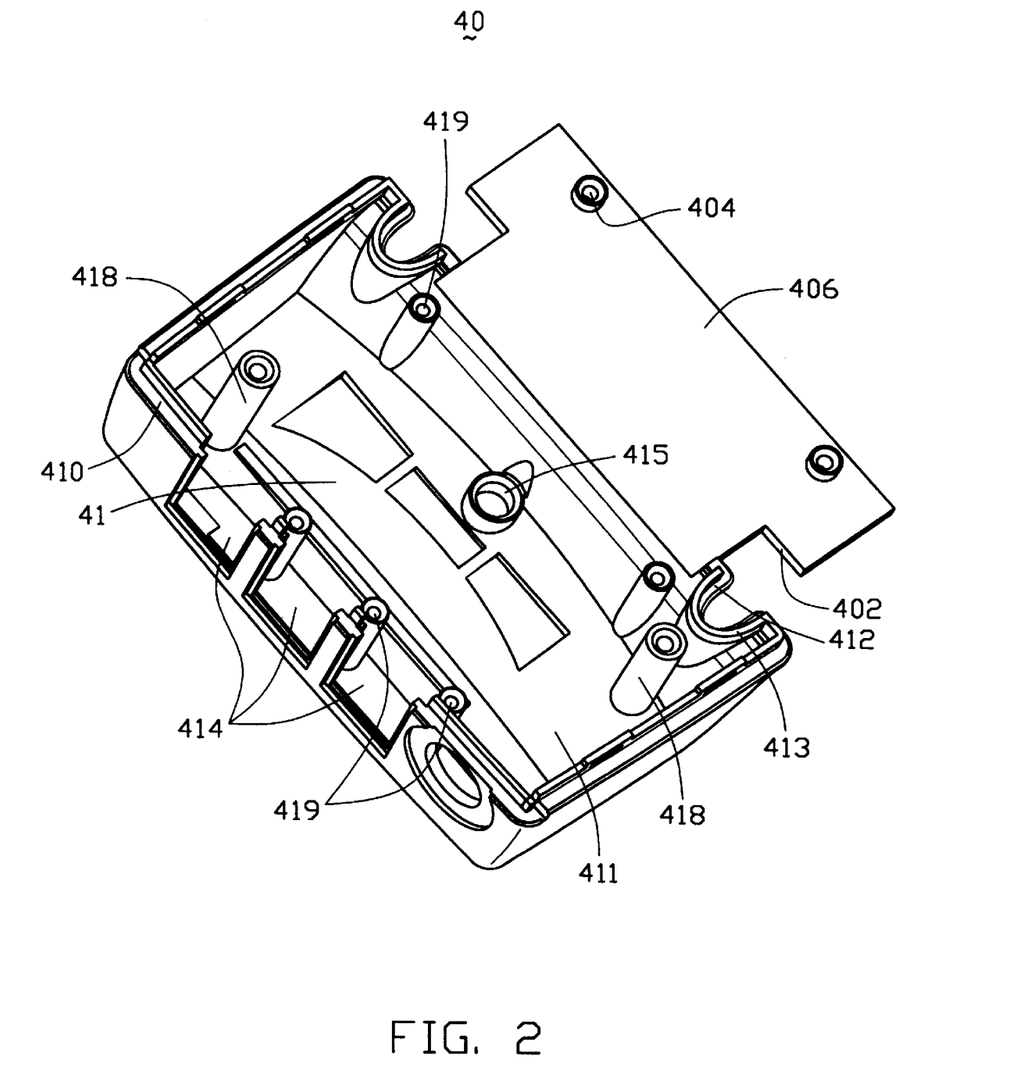
FIG. 2 is an enlarged inverted perspective view of an upper housing of FIG. 1.

The supporting member 4 includes an upper housing 40 and a lower housing 42 for enclosing and supporting the IEEE 1394 connectors 51 and the power connector 52. Referring particularly to FIG. 2, the upper housing 40 has an upper casing 41, and a flat mounting board 406 extending rearwardly from the upper casing 41. The upper casing 41 has a ceiling 411, a pair of rear flanges 412 from between which the mounting board 406 extends, and a front wall 410 opposite the rear flanges 412. Each rear flange 412 forms an indented upper arched wall 413. The front wall 410 defines three first openings 414. The ceiling 411 has a pair of diagonally opposite downwardly extending, internally threaded sleeves 418, and a window 415 corresponding to the LED 7 of the PCB 3. Five positioning posts 419 extend downwardly from the ceiling 411. Three of the positioning posts 419 are aligned parallel to and near the first openings 414. The other two positioning posts 419 are respectively located near the arched walls 413. The mounting board 406 has a pair of Z-shaped lateral edges 402 and a pair of second bores 404 near a rear edge of the mounting board 406.

Figure 3:
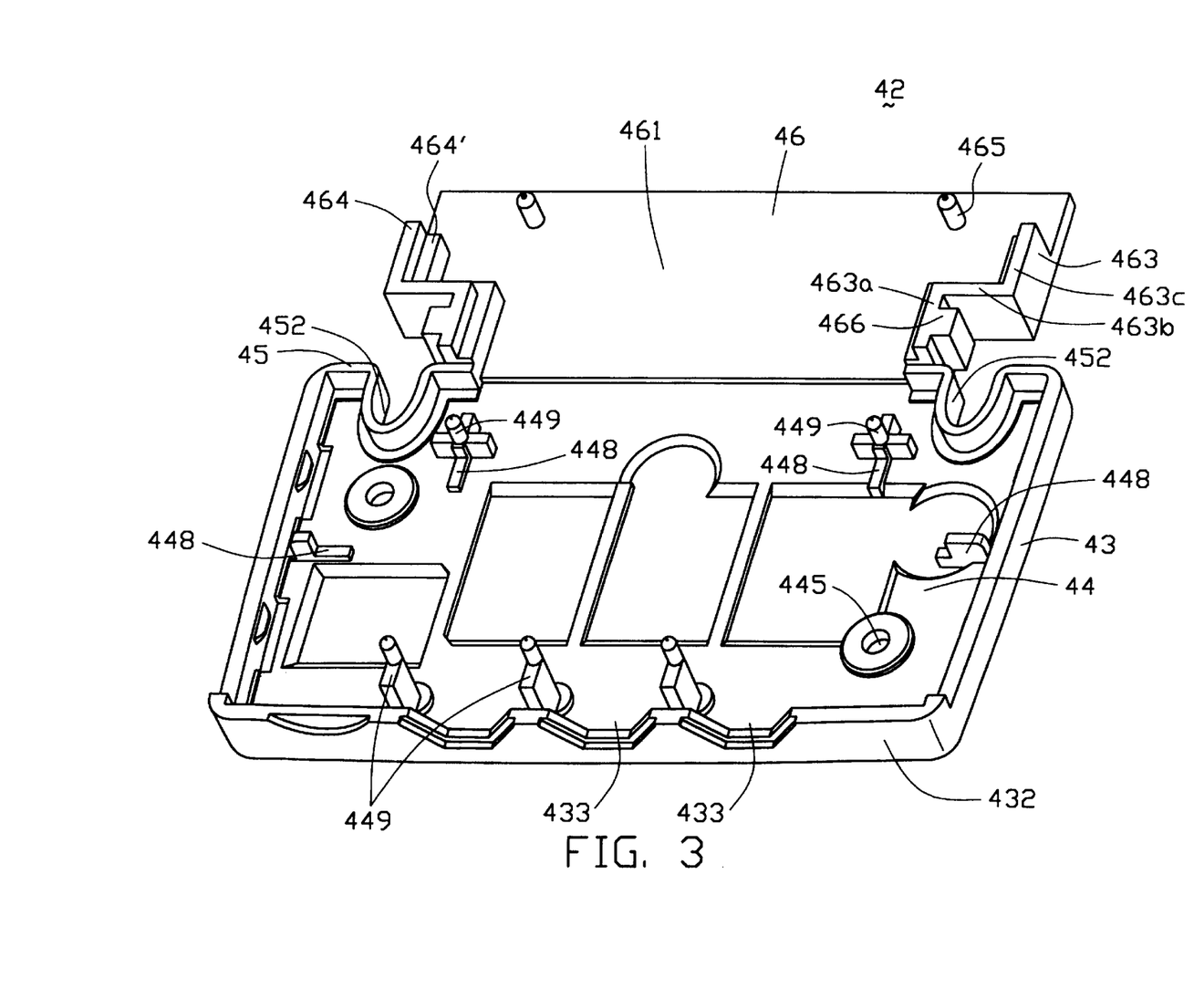
FIG. 3 is an enlarged perspective view of a lower housing of FIG. 1.

Referring to FIG. 3, the lower housing 42 includes a lower casing 43 and a base board 46 extending rearwardly from the lower casing 43. The lower casing 43 comprises a floor 44, a cross wall 432 located at a front side of the floor 44, and a pair of rear walls 45 opposite the cross wall 432. The floor 44 defines a pair of diagonally opposite second holes 445 corresponding to the threaded sleeves 418 of the upper casing 41. Five pegs 449 extend inwardly from the floor 44, corresponding to the positioning posts 419 of the upper casing 41. Two securing members 448 are respectively formed at two rear corners of the floor 44, and another two securing members 448 are respectively formed at opposite sides of the floor 44. Each securing member 448 has an L-shaped profile, such that the four securing members 448 cooperatively accommodate the PCB 3 therebetween. The cross wall 432 has three second openings 433 defined therein, corresponding to the first openings 414 of the upper casing 41. Each rear wall 45 has an indented lower arched wall 452, corresponding to the upper arched wall 413 of the upper casing 41. The base board 46 extends rearwardly from between the rear walls 45 of the lower casing 43. The base board 46 includes a flat plate 461, a pair of Z-shaped shoulder walls 463 located at forward, lateral sides of the plate 461, and a pair of pins 465 near a rear side of the plate 461. The shoulder walls 463 are stepped such that each shoulder wall 463 has an outer first step wall 464 and an inner second step wall 464'. Each shoulder wall 463 includes a connecting wall 463a connecting with a corresponding rear wall 45, an abutting wall 463b forming the middle portion of the Z-shape, and a side wall 463c extending along a lateral side of the plate 461. Each connecting wall 463a forms an outwardly extending block 466 thereon.

The upper cover 20 and the lower cover 22 are essentially conventional. This facilitates utilization of conventional molds when manufacturing the I/O card assembly 1.

The upper cover 20 includes a metal first platform 201, a pair of longitudinal rails 205 extending outwardly, downwardly, and then inwardly from opposite lateral edges of the first platform 201 respectively, a pair of latches 203 respectively depending from opposite ends of a front edge of the first platform 201, and a pair of tails 207 respectively extending rearwardly from opposite ends of a rear edge of the first platform 201.

The lower cover 22 has a metal second platform 221 and a pair of dielectric frames 24 injection molded with lateral sides of the platform 221. Each frame 24 comprises a rod 245, a front head 241 projecting perpendicularly inwardly from a front end of the rod 245, and a rear head 247 projecting perpendicularly inwardly from a rear end of the rod 245. Each front head 241 defines a cutout 244 in an inner surface thereof and a recess 243 in a front surface thereof. Each rear head 247 defines a notch 246 in an inner surface thereof.

Figure 4:
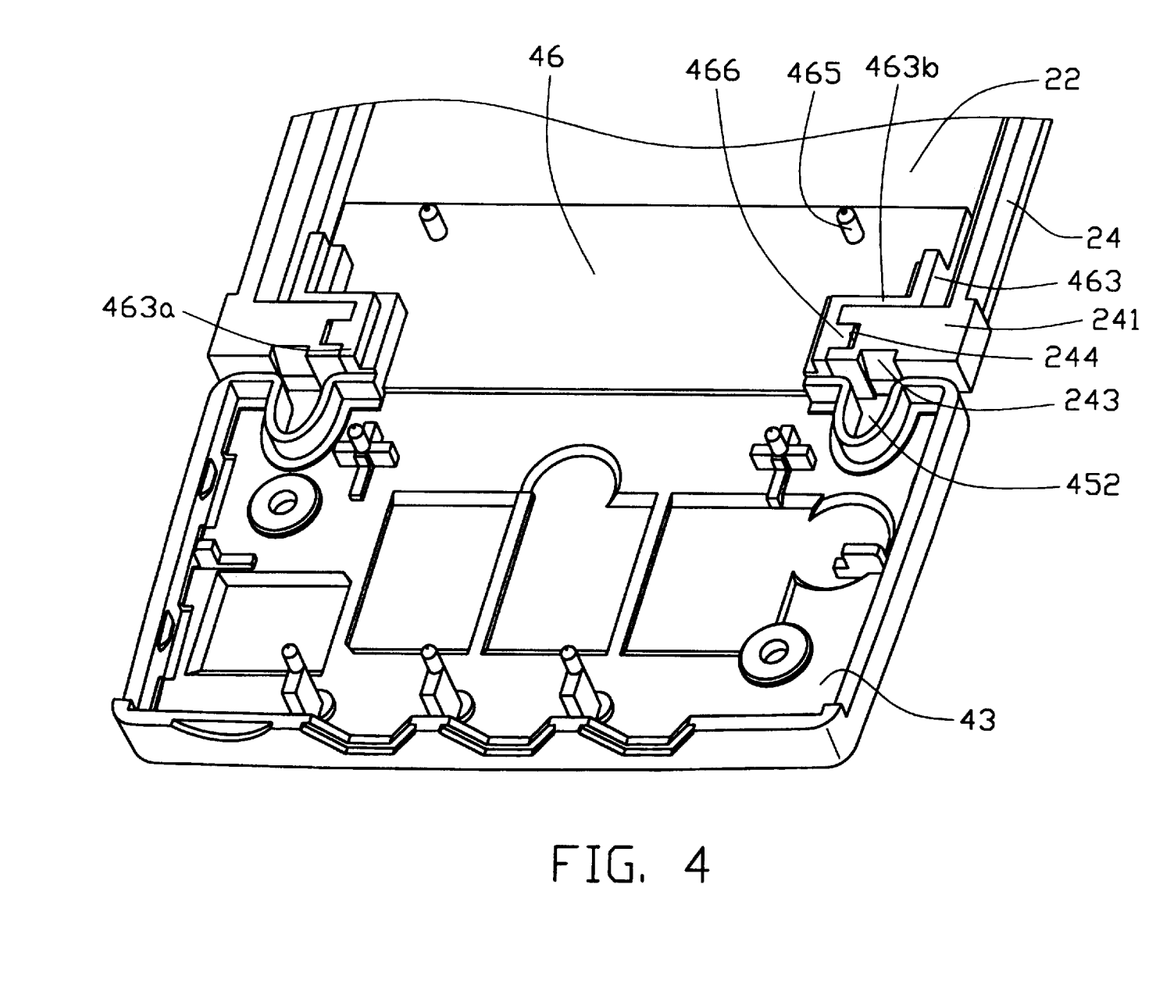
FIG. 4 is a partially assembled view of the I/O card assembly of FIG. 1, showing the lower housing mounted to a lower cover of the I/O card assembly.

As is shown in FIG. 4, the lower housing 42 is mounted to the lower cover 22 so that the lower casing 43 protrudes forwardly from the lower cover 22 and the base board 46 is received in the lower cover 22. The blocks 466 of the connecting walls 463a of the shoulder walls 463 are received in the corresponding cutouts 244 of the front heads 241 of the frames 24. Each abutting wall 463b of the shoulder wall 463 abuts against a rear surface of the corresponding front head 241. Thus the abutting walls 463b cooperate with the blocks 466 to reliably secure the lower housing 42 to the frames 24. The arched walls 452 oppose the corresponding recesses 243.

Figure 5:
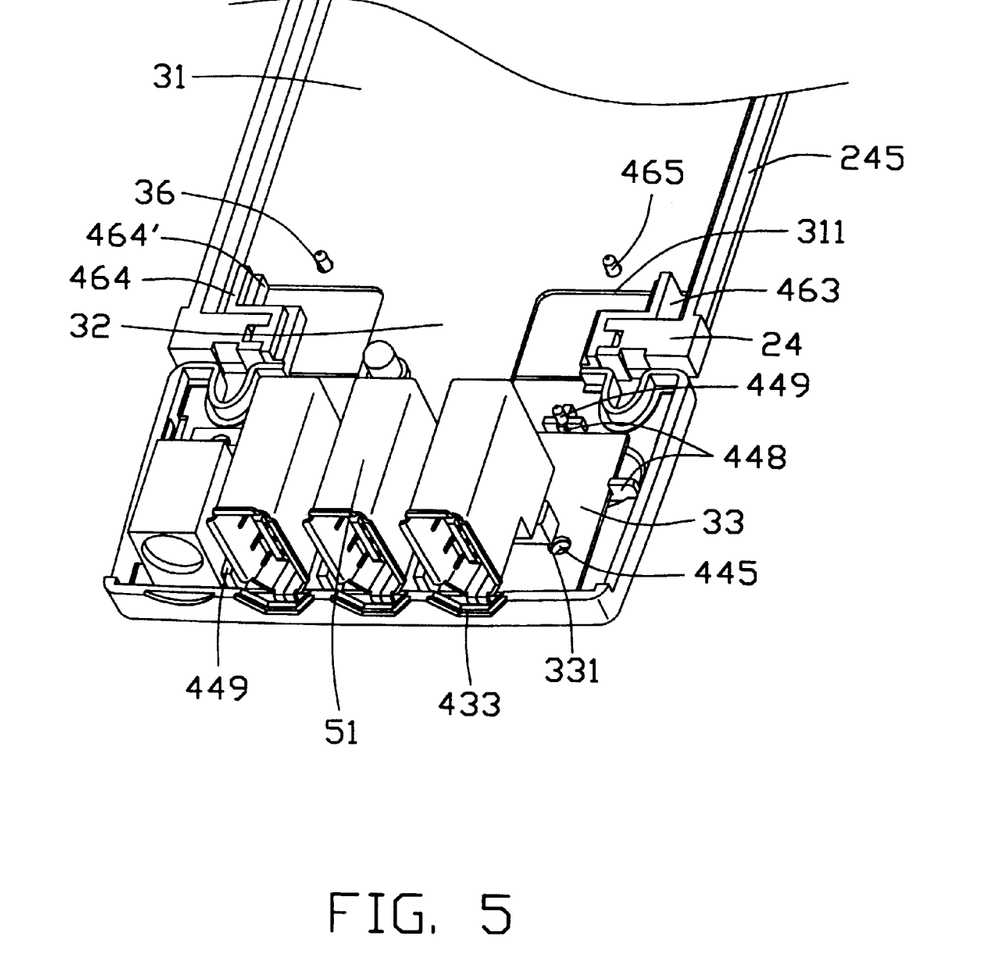
FIG. 5 is a partially assembled view of the I/O card assembly of FIG. 1, showing a printed circuit board of the I/O card assembly mounted to the partly-assembled I/O card assembly of FIG. 4.

Referring to FIG. 5, the PCB 3 is subsequently inserted into the combined lower housing 42 and the lower cover 22, with the pins 465 of the base board 46 being extended through the first bores 36 of the PCB 3. The body section 31 of the PCB 3 is received between the rods 245 of the lower cover 22. The abutting edges 311 of the PCB 3 abut against rear surfaces of the side walls 463c of the shoulder walls 463 of the lower cover 22. The receptacle connector 6 of the PCB 3 is retained by and between the rear heads 247 of the lower cover 22, with the protrusions 60 of the PCB 3 engaging in the corresponding notches 246 of the lower cover 22. The neck section 32 of the PCB 3 extends between the shoulder walls 463 into the lower casing 43. The head section 33 of the PCB 3 is fixed between the securing members 448 of the lower casing 43, such that the three pegs 449 of the lower casing 43 respectively interpose the IEEE 1394 connectors 51 and the power connector 52 of the PCB 3. The first holes 331 of the PCB 3 align with the corresponding second holes 445 of the lower casing 43.

Figure 6:
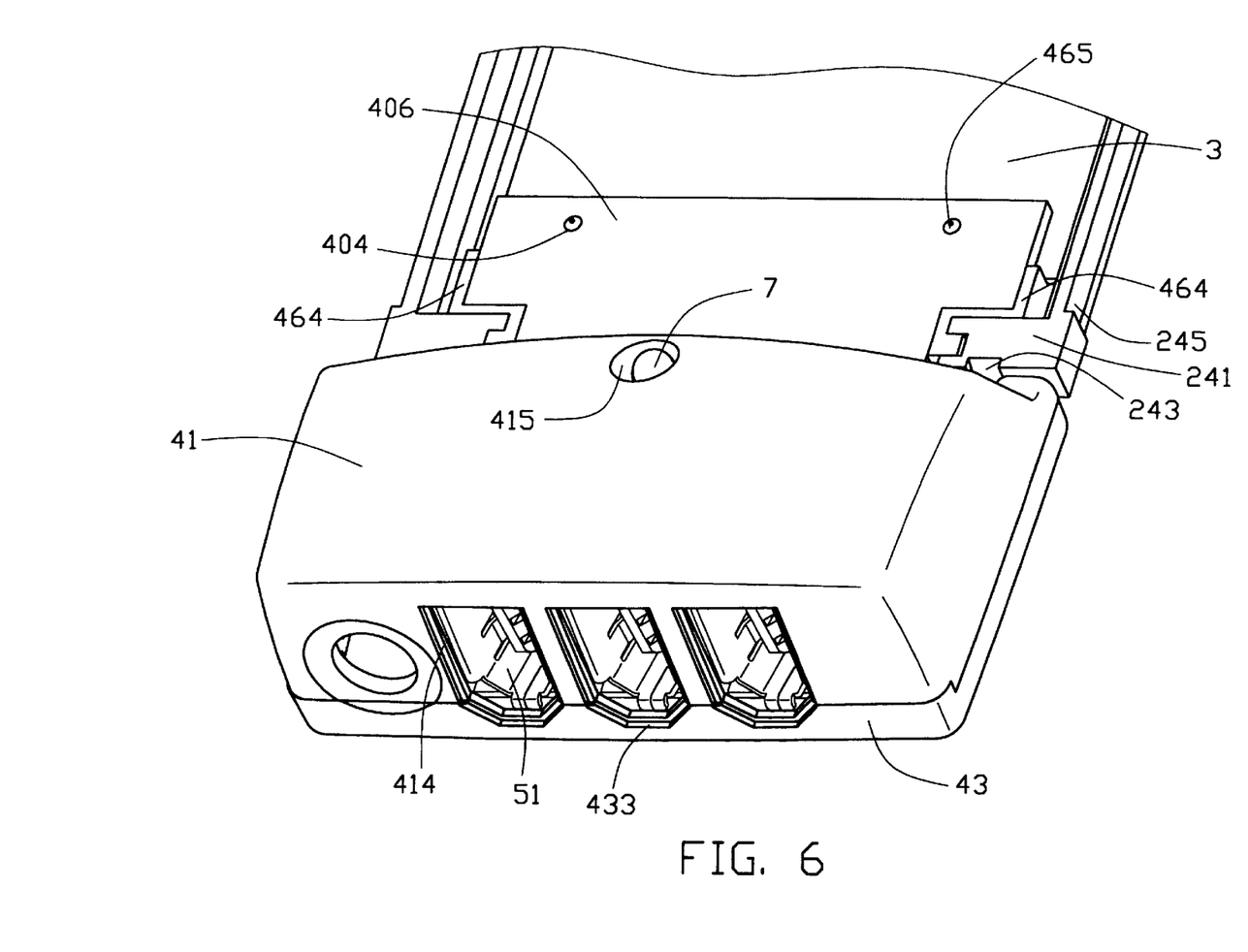
FIG. 6 is a partially assembled view of the IC card assembly of FIG. 1, showing the upper housing mounted to the partly-assembled card assembly of FIG. 5.

Referring to FIG. 6, the upper housing 40 is then mounted to the lower housing 42. The pins 465 of the lower housing 42 extend through the first bores 36 of the PCB 3 into the second bores 404 of the mounting board 406. The pegs 449 of the lower housing 42 extend into the positioning posts 419 of the upper casing 41. The sleeves 418 of the upper casing 41 are aligned with the second holes 445 of the lower casing 43. The lower arched walls 452 of the lower casing 43 align with the upper arched walls 413 of the upper casing 41. Moreover, the second step walls 464' of the lower housing 42 support the mounting board 406 such that the mounting board 406 does not contact the PCB 3. The first step walls 464 of the lower housing 42 engagingly abut the lateral edges 402 of the mounting board 406. Thus, the upper housing 40 engages with the lower housing 42 to enclose the IEEE 1394 connectors 51, the power connector 52 and the head section 33 of the PCB 3. The first openings 414 of the upper casing 41 communicate with the corresponding second openings 433 of the lower casing 43, allowing complementary connectors of the peripheral device (not shown) to extend through the first and second openings 414, 433 to mate with the IEEE 1394 connectors 51 and the power connector 52. The LED 7 of the PCB 3 extends through the window 415 of the upper casing 41, for indicating operational status of the I/O card assembly 1.

Figure 7:
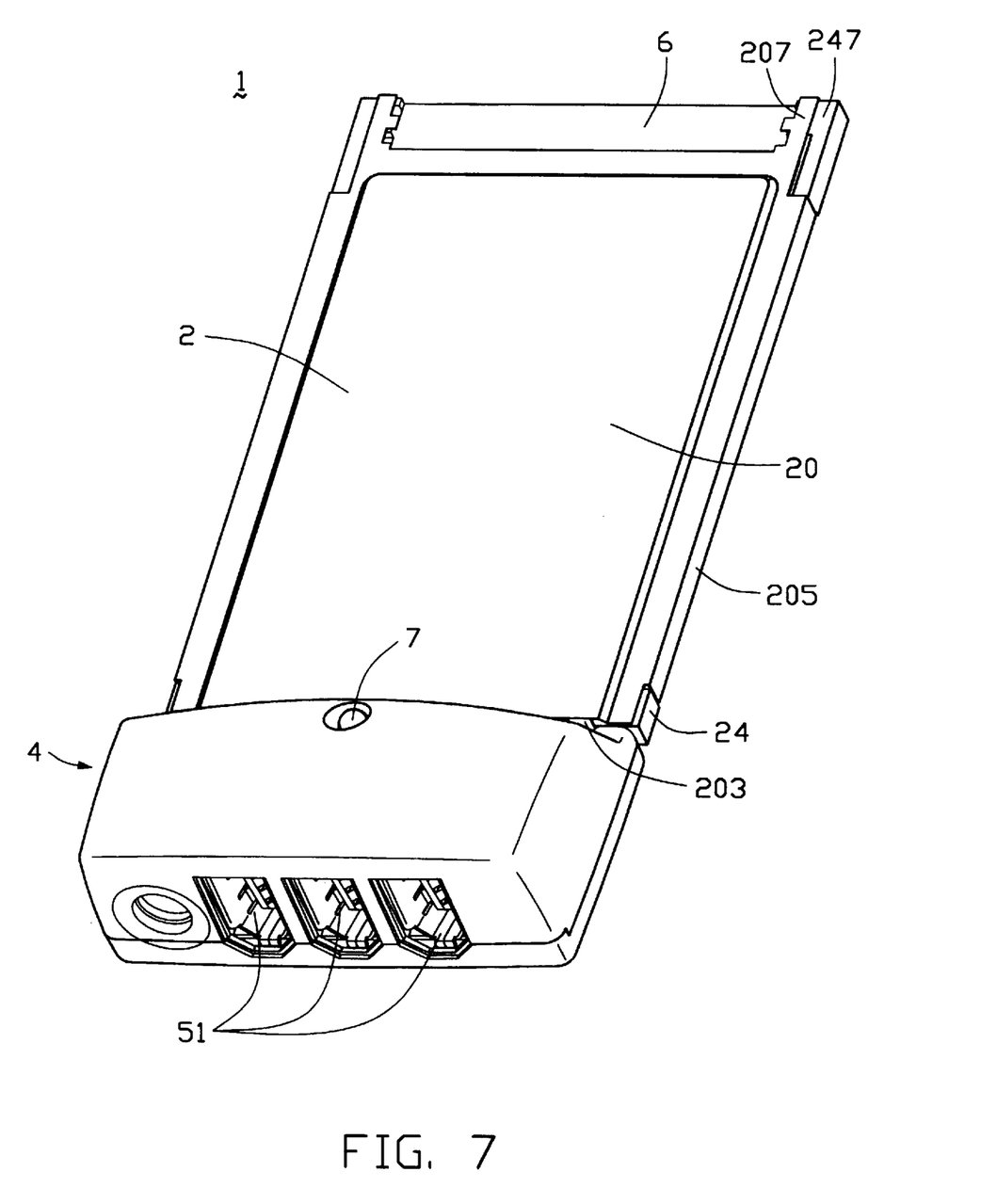
FIG. 7 is a fully assembled view of the I/O card assembly of FIG. 1.

Finally, as is shown in FIG. 7, the upper cover 20 is latched to the lower cover 22. The rails 205 of the upper cover 20 engage the corresponding rods 245 of the lower cover 22, and the latches 203 of the upper cover 20 extend through the corresponding recesses 243 of the lower cover 22 to engage with the front heads 241 of the lower cover 22. Each tail 207 of the upper cover 20 is bent to abut against a rear surface of the rear head 247 of the lower cover 22. The bolts 8 are extended through the second holes 445 of the lower casing 43 and the first holes 331 of the PCB 5, and then screwed into the corresponding sleeves 418 of the upper casing 41 to form the PCMCIA card assembly 1. A card portion 2 of the PCMCIA card assembly 1 comprises and is enclosed by the upper and lower covers 20, 22. The card portion 2 is adapted for insertion into the host device (not shown), while the upper and lower casings 41, 43 of the supporting structure 4 are adapted to protrude from the host device. Since the upper and lower casings 41, 43 protrude from the host device, they can be manufactured with varying heights and dimensions to receive corresponding electrical connectors of varying heights and dimensions.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An I/O card assembly for connecting a host device with a peripheral device, comprising:

a printed circuit board, a receptacle connector for connecting with the host device being located at a rear end of the printed circuit board, and a mating connector for connecting with the peripheral device being mounted on a front end of the printed circuit board, the mating connector having a profile higher than the receptacle connector;

a dielectric supporting member enclosing and supporting the mating connector;

a lower cover having a pair of frames at lateral sides thereof, each frame forming a front head at a front end thereof and a rear head at a rear end thereof, the receptacle connector being retained by and between the rear heads, the mating connector being located in front of the front heads; and an upper cover latched to the lower cover; wherein the supporting member has at least one casing projecting forwardly from the upper cover and the lower cover, and at least one board engaging with the front heads to secure the supporting member to the covers.

2. The I/O card assembly as claimed in claim 1, wherein the printed circuit board includes a body section received between the frames of the lower cover, and a head section extending forwardly beyond the front heads for being enclosed in the casing.

3. The I/O card assembly as claimed in claim 2, wherein the supporting member has securing members located in the casing for securing the head section of the printed circuit board to the supporting member.

4. The I/O card assembly as claimed in claim 2, wherein the printed circuit board further comprises a neck section on which a light-emitting diode is positioned, the light-emitting diode extending through a window defined in the upper casing of the upper housing of the supporting member for indicating operational status of the I/O card assembly.

5. The I/O card assembly as claimed in claim 1, wherein the casing includes a lower casing and an upper casing engageable with the lower casing for enclosing the mating connector, and wherein the board extending rearwardly from the lower casing and the mounting board extending rearwardly from the upper casing.

6. The I/O card assembly as claimed in claim 5, wherein the lower casing has at least one positioning post cooperating with at least one peg located on the upper casing for positioning the mating connector relative to the supporting member.

7. The I/O card assembly as claimed in claim 6, wherein the upper casing has a pair of diagonally opposite sleeves on a ceiling thereof and a pair of corresponding diagonally opposite second holes defined in a floor of the lower casing, the sleeves and the second holes being fastened by a pair of bolts.

8. The I/O card assembly as claimed in claim 7, wherein the base board and the mounting board cooperate to position the body section of the printed circuit board such that a pair of pins located at the base board extends through first bores defined in the body section and second bores defined in the mounting board.

9. The I/O card assembly as claimed in claim 8, wherein the base board forming a pair of shoulder walls which engage with the front heads to position the supporting member relative to the frames of the lower cover.

10. The I/O card assembly as claimed in claim 9, wherein the shoulder walls of the base board of the lower housing are stepped for engagingly abutting the mounting board and supporting the mounting board to distance from the printed circuit board.

11. The I/O card assembly as claimed in claim 9, wherein each of the shoulder walls of the base board of the lower housing includes a connecting wall connecting with the lower casing, an abutting wall, and a side wall which abuts against a front abutting edge of the body section of the printed circuit board.

12. The I/O card assembly as claimed in claim 11, wherein a block outwardly extends from the connecting wall of each shoulder wall for being received in a cutout of the corresponding front head of the lower cover, thereby securing the lower housing to the lower cover.

13. The I/O card assembly as claimed in claim 12, wherein the abutting walls abut against rear surfaces of the front heads of the lower cover, and cooperate with the blocks of the shoulder walls to secure the lower housing to the lower cover.

14. The I/O card assembly as claimed in claim 9, wherein the lower casing forms a pair of indented arched walls respectively at lateral, rear sides thereof.

15. The I/O card assembly as claimed in claim 14, wherein the front heads of the lower cover respectively define a pair of recesses in front surfaces thereof, and the recesses oppose the corresponding arched walls of the lower casing.

16. The I/O card assembly as claimed in claim 15, wherein the upper cover forms a pair of latches extending through the recesses of the lower cover for latching the upper cover to the lower cover.

17. An I/O card assembly comprising:

a printed circuit board with a neck portion thereof;

a plurality of mating connectors mounted on a front end of said printed circuit board;

a dielectric supporting member enclosing and supporting said mating connectors and positioning the front end of the printed circuit board as well as the mating connectors;

cover means enclosing the printed circuit board except that the neck portion projects forwardly out of said cover means;

said supporting member including means extending rearwardly into a front end of the cover means for engaging not only the cover means but also the printed circuit board.

18. The assembly ass claimed in claim 17, wherein the profile of said supporting member is much higher than that of the cover means.

* * * * *